(12) United States Patent
Dreps et al.

(10) Patent No.: US 6,933,752 B2
(45) Date of Patent: Aug. 23, 2005

(54) METHOD AND APPARATUS FOR INTERFACE SIGNALING USING SINGLE-ENDED AND DIFFERENTIAL DATA SIGNALS

(75) Inventors: Daniel Mark Dreps, Georgetown, TX (US); Frank David Ferraiolo, Essex Junction, VT (US)

(73) Assignee: International Business Machines Corporation, Armonk, NY (US)

(*) Notice: Subject to any disclaimer, the term of this patent is extended or adjusted under 35 U.S.C. 154(b) by 337 days.

(21) Appl. No.: 09/870,623

(22) Filed: May 31, 2001

(65) Prior Publication Data

US 2002/0180480 A1 Dec. 5, 2002

(51) Int. Cl.[7] ................................................ H03K 5/22
(52) U.S. Cl. .......................................... 327/65; 327/71
(58) Field of Search ............................. 327/65–67, 69, 327/71, 74, 75; 326/59, 60; 330/258

(56) References Cited

U.S. PATENT DOCUMENTS

| | | | | |
|---|---|---|---|---|
| 3,743,856 A | * | 7/1973 | Leuthold | 326/54 |
| 4,167,727 A | * | 9/1979 | Anderson et al. | 326/38 |
| 4,649,301 A | * | 3/1987 | Van Tran | 327/53 |
| 4,670,673 A | * | 6/1987 | Varadarajan | 326/75 |
| 5,936,466 A | * | 8/1999 | Andoh et al. | 330/253 |
| 5,936,469 A | * | 8/1999 | Alexander et al. | 330/258 |

\* cited by examiner

*Primary Examiner*—Kenneth B. Wells
(74) *Attorney, Agent, or Firm*—Weiss, Moy & Harris, P.C.; Andrew M. Harris; Casimer K. Salys (57) ABSTRACT

A method and apparatus for interface signaling using single-ended and differential data signals improves performance of an interface. A differential pair of data signals and at least one single-ended data signal are transmitted over the interface. The differential pair of data signals is received by a differential receiver and the single-ended data signals are received by a receiver that uses the differential pair of data signals to improve the detection of the single-ended data signal. A novel receiver having a differential input and a single-ended input combines the differential pair of data signals with a single-ended data signal to detect the single-ended data signal providing improved common-mode rejection and reducing the error rate of the single-ended signal. Multiple single-ended signals may be associated with one differential signal, providing a scalable architecture grouping a number of single-ended signals with each differential pair of signals.

17 Claims, 5 Drawing Sheets

METHOD AND APPARATUS FOR INTERFACE SIGNALING USING SINGLE-ENDED AND DIFFERENTIAL DATA SIGNALS

BACKGROUND OF THE INVENTION

1. Technical Field

The present invention relates generally to interface signaling, and more particularly, to an interface using both differential and single-ended signals.

2. Description of the Related Art

Interfaces between present-day integrated circuits have increased in operating frequency and width. In particular, microprocessor systems components require both wide and fast connection. Data width directly affects the speed of data transmission between systems components, as does the data rate, which is limited by the maximum frequency that can be supported by an interface.

Present-day systems interconnect designs use transmission line techniques to improve signal transmission/reception. Low voltage and current signaling levels are desirable to reduce driver size, power consumption/dissipation and electromagnetic interference (EMI). Reduced signal levels require improved detection techniques, such as that provided by a differential signaling scheme.

A differential signaling scheme provides a significant improvement over single-ended signaling, as a differential interface is far less susceptible to common mode noise, produces a more uniform load on the interface power supplies and has a reduced bit error rate (BER).

However, an exclusively differential interface requires twice the number of interconnects and associated drivers, as well as a differential receiver for each data signal. Due to the large data widths required in present-day systems, it is not practical to implement a completely differential interface. Interfaces have been developed to improve the detection of single-ended signals, but these require transmission of separate clock signals or other reference signals that provide improved performance, but require interconnects for the reference signals. Additionally, the fan-out requirements of the reference signals complicate the scalability of the designs. When interface width is increased, the number of receivers is also increased, increasing the load on the reference signal, compromising interface performance or requiring additional signal paths and drivers to provide more reference interconnects.

It is therefore desirable to provide a method and apparatus for interface signaling using single-ended and differential data signals without requiring separate reference signals.

SUMMARY OF THE INVENTION

The objective of interface signaling using single-ended and differential data signals without requiring separate reference signals is accomplished in a method and apparatus for interface signaling using single-ended and differential data signals. At least one single-ended data signal and a differential pair of data signals are transmitted across an interface and a receiver receives the differential pair of data signals along with the single-ended signals. The single-ended data signals are detected using the differential pair of data signals as a reference so that the detection of the single-ended data signals is enhanced. The single-ended data signals may be detected with singlential comparators having a differential data signal input and a single-ended data signal input.

The foregoing and other objectives, features, and advantages of the invention will be apparent from the following, more particular, description of the preferred embodiment of the invention, as illustrated in the accompanying drawings.

BRIEF DESCRIPTION OF THE DRAWINGS

The novel features believed characteristic of the invention are set forth in the appended claims. The invention itself, however, as well as a preferred mode of use, further objectives, and advantages thereof, will best be understood by reference to the following detailed description of an illustrative embodiment when read in conjunction with the accompanying drawings, wherein like reference numerals indicate like components, and:

DESCRIPTION OF ILLUSTRATIVE EMBODIMENT

Figure 1:
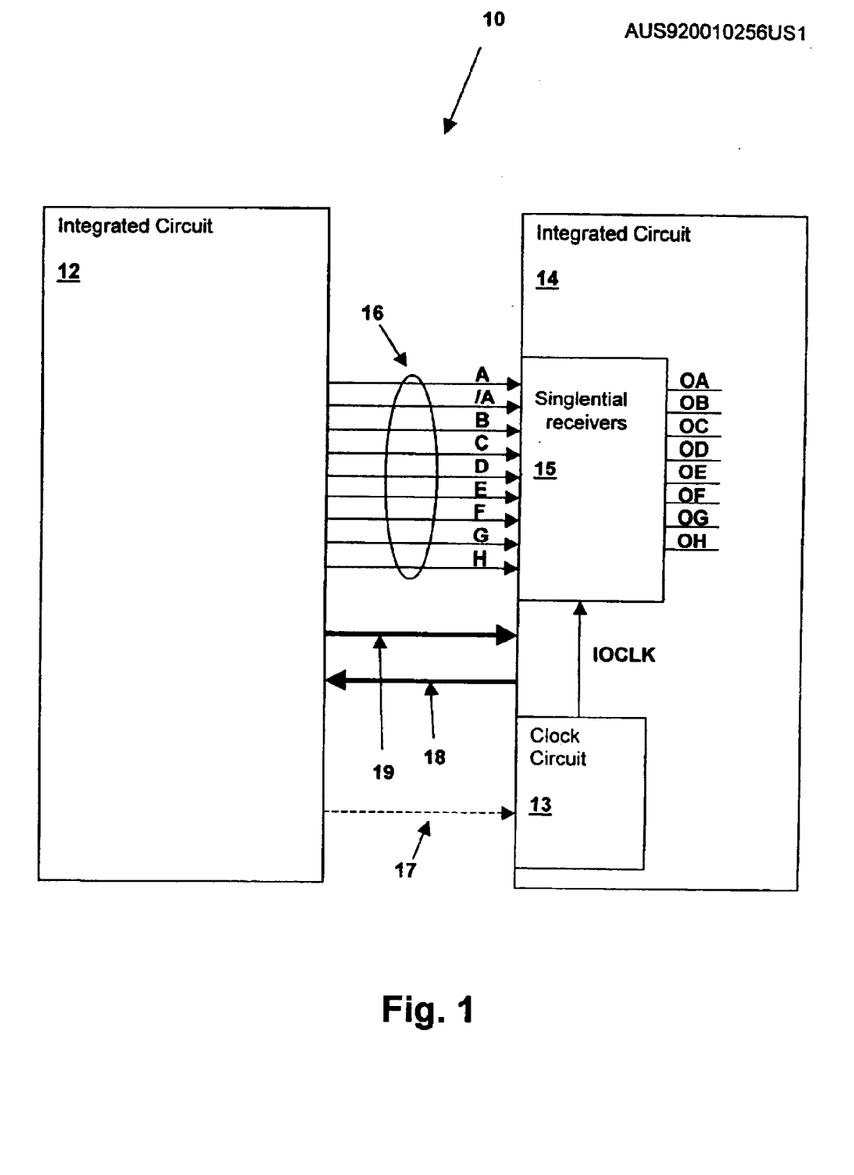
FIG. 1 is a block diagram of an interface in accordance with a preferred embodiment of the invention.

With reference now to the figures, and in particular with reference to FIG. 1, there is depicted a block diagram of an interface 10 in accordance with a preferred embodiment of the invention. Integrated circuit 12 is coupled to a second integrated circuit 14 by a data bus 16, a data bus 18, a data bus 19 and an optional clock signal 17. While bus 16 is illustrated as a unidirectional bus coupling signals transmitted from integrated circuit 12 to integrated circuit 14 and while bus 16 will be the focus of the illustrative description, it should be understood that the techniques and circuits of the present invention apply to bidirectional buses and the integrated circuit 12 may include circuitry as illustrated in integrated circuit 14 to receive signals transmitted from integrated circuit 14 to integrated circuit 12 via bus 18.

To achieve high speed, low power and low noise in interface designs, all of which are desirable characteristics, the signals transmitted from integrated circuit 12 to integrated circuit 14 by bus 16 are detected with special circuits. As the signal swing is reduced or the signaling frequency is increased, receivers are employed to reduce interface error. The present invention uses a novel combination of single-ended signals (illustrated as signals B–H) and a differential signal (illustrated as signal A and /A) to achieve the above-mentioned objectives.

Existing interface techniques use separate voltage reference signals or combined clock/voltage reference signals to provide a reference for receivers, permitting rejection of common-mode noise and common-mode voltage variations. The present invention uses a differential data signal to provide such voltage reference. Advantages of the present invention include reduction of signals required (as a separate reference signal is not required) and scalability of the design. When bus width is increased, the fan-out of a separate reference signal is consequently increased and at some point it will be necessary to add more reference signals to detect the added data signals, due to the loading of the reference signal by the receiver circuits.

Additionally, in an actual integrated circuit layout, input/output (I/O) blocks are generally large with respect to other circuits due to the drive requirement of the transmitters and power dissipation in the receivers, so it may not be possible to co-locate all of the I/O blocks associated with a given interface. In this case, it would not be desirable to route a single reference signal between I/O blocks that are far apart on an actual integrated circuit die. Common-mode noise and voltage levels will vary between distant blocks. Therefore it is more desirable to use a differential data pair associated in common I/O blocks for detection of single-ended data signals in order to provide the best tracking and common-mode noise rejection for that group of signals.

The present invention uses a differential data signal to detect multiple other single-ended data signals. While the illustrative embodiment of FIG. 1 depicts a grouping of eight data signals where one of the signals is differential, the actual ratio of differential to single ended signals within a given bus is a design choice made by the characteristics desired and an implementation of the present invention may use a single differential pair to detect larger or smaller number of single-ended signals.

The circuits used to detect the data signals within bus 16 are "singlential" receivers 15 included within integrated circuit 14. Singlential receivers 15 receive data signals A–H from bus 16 and produce data outputs OA–OH for connection to other circuits within integrated circuit 14. A clock circuit 13 provides an IOCLK signal to clock latches within singlential receivers 15. The IOCLK signal may be derived in a variety of manners. Optional interface clock signal 17 (which may be a single-ended signal or a differential pair) may be detected to provide an interface clock that is synchronous with data signals A–H. Alternatively, clock circuit 13 may be coupled to one or more of data signals A–H and include clock reconstruction circuits to generate a clock from one or more of data signals A–H. The IOCLK signal provides a timing reference for the detection of data signals A–H, but the voltage reference is provided by the differential data signal pair A and /A.

Figure 2:
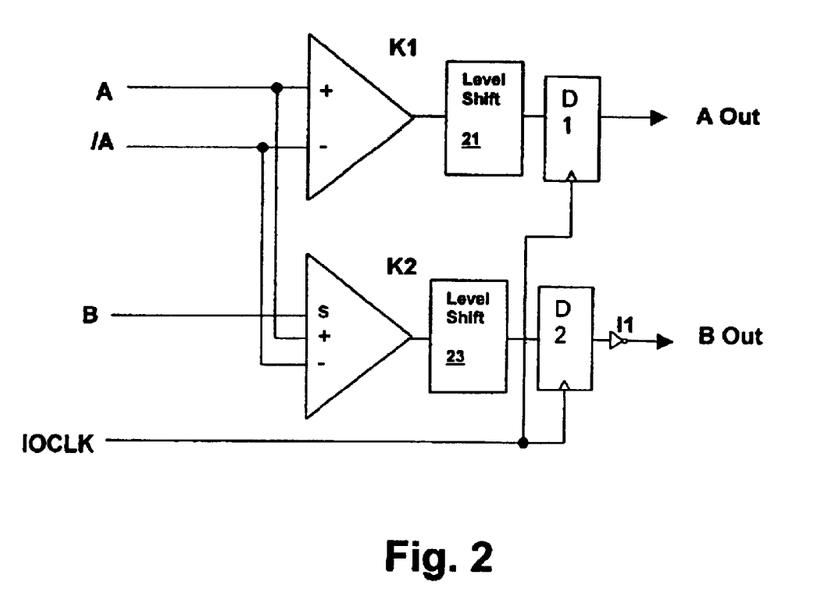
FIG. 2 is a schematic diagram of a receiver in accordance with a preferred embodiment of the invention.

Referring now to FIG. 2, a schematic diagram of a singlential receiver in accordance with a preferred embodiment of the invention is depicted. A differential comparator K1 compares signals A and /A to produce an output signal that is latched by a latch D1 to produce an output data signal A Out. A level shift 21 is coupled to the output of comparator K1 to remove shift in the logic low output level of the comparator due to the presence of common mode voltage on the input signals. Latch D1 latches the output of level shift 21 on the rising edge of IOCLK (IOCLK is a clock signal derived such that data will be stable at the outputs of comparator K1 when IOCLK rises). A novel singlential comparator K2 receives the differential pair comprising signals A and /A as well as single-ended data signal B. Singlential comparator K2 detects data signal B such that a common-mode voltage appearing on signals B, A, and /A is rejected. A level shift 23 couples the output of singlential comparator K2 to a latch D2. Level shift 23 removes variations in the logic low voltage level on the output of singlential comparator K2 due to the presence of common mode voltage on the input signals.

The output of level shift 23 is latched by latch D2 which is clocked by the IOCLK signal and inverted by inverter I1 to produce a data output signal B Out. If data signal B is at a low logic level (corresponding to a lower voltage level), the output of singlential comparator K2 will be at a high logic level, causing latch D2 to latch a high logic level at its output and coupling a high logic level input to inverter I1. The result of the operation of the circuit of FIG. 2 is an A Out signal and a B Out signal that are very closely time-aligned, are representative of their corresponding A and B data input signals and have common mode error removed.

Figure 3A:
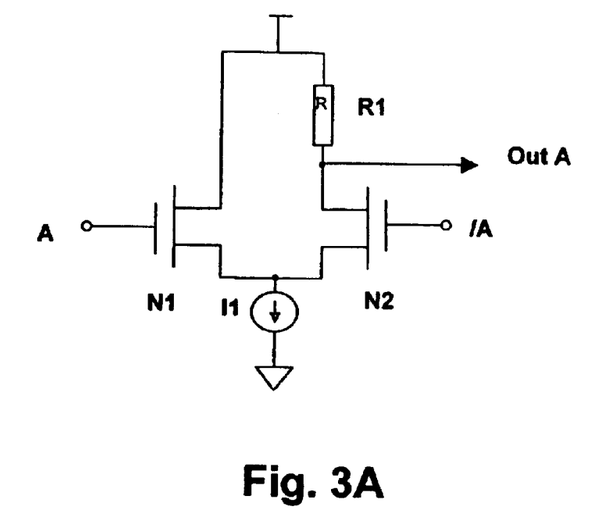
FIG. 3A is a schematic diagram of the differential comparator of FIG. 2 in accordance with a preferred embodiment of the invention.

Referring now to FIG. 3A, a detailed schematic of differential comparator K1 of FIG. 2 is depicted. N-channel transistor N1 and N-channel transistor N2 form a differential pair. When the voltage of data signal A is higher than the voltage of complementary data signal /A, N-channel transistor N1 will provide the majority of the current sourced into constant-current sink I1, causing the voltage at Out A to assume a high logic level. Conversely when the voltage of data signal A is lower than the voltage of complementary data signal /A, N-channel transistor N2 will provide the majority of the current sourced into constant-current sink I1, causing the voltage at Out A to assume a low logic level by drawing current through resistor R1 which has a resistance value of R.

The logic low output level of differential comparator K1 is Vdd−IR where I is the current source magnitude and Vdd is the positive power supply voltage. For positive levels of the common-mode voltage appearing on the gates of transistors N1 and N2, it is understood that both transistors N1 and N2 will conduct, raising the voltage across current source I1 and thus the logic low output level. The variation in logic low output level of comparator K1 can be compensated for by using a level shifting circuit or by using a negative power supply rail that is below the desired logic low output voltage.

Figure 3B:
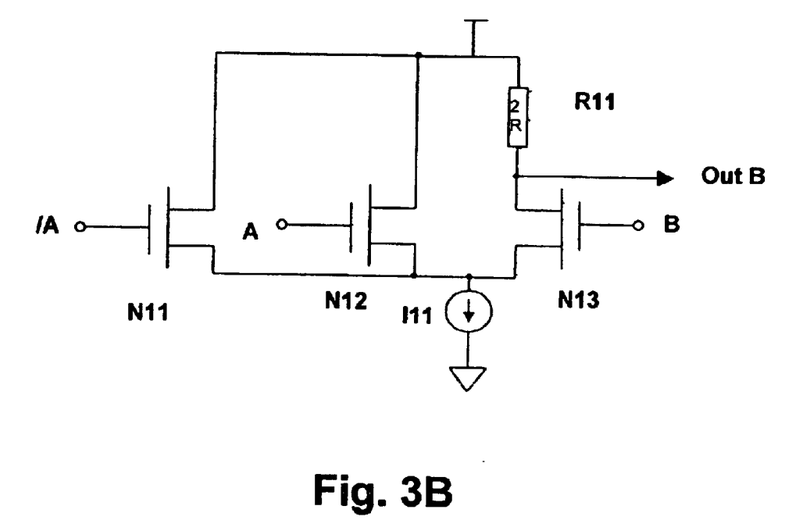
FIG. 3B is a schematic diagram of the singlential comparator of FIG. 2 in accordance with a preferred embodiment of the invention.

Referring now to FIG. 3B, a detailed schematic of singlential comparator K2 of FIG. 1 is depicted. N-channel transistors N11 and N12 form one side of a quasi-differential pair. N-channel transistor N13 provides the other side of the quasi-differential pair. When the voltage of data signal B is at a high logic level, N-channel transistor N13 will share current sourced into constant-current sink I11 with the differential input transistor (N11 or N12) coupled to the differential input signal that is also at a high logic level. The current sourced through transistor N13 causes the voltage at Out B to assume a low logic level by drawing current through resistor R11 which has a resistance value of 2R. Conversely, when the voltage of data signal B is at a low voltage level, the transistor (N11 or N12) coupled to the differential input signal that is at a high logic level will conduct the majority of the current sourced into constant-current sink I11, causing the voltage at Out B to assume a high logic level.

The logic low output level of singlential comparator K2 is Vdd−IR where I is the current source magnitude and Vdd is the positive power supply voltage. Resistor R11 is twice the value of the differential comparator K1 output resistor R1, but transistor N13 will only conduct approximately half of the current source I11 current. For positive levels of the common-mode voltage appearing on the gates of transistors N11, N12 and N13, it is understood that all of transistors N11, N12 and N13 will conduct, raising the voltage across current source I11 and thus the logic low output level. The variation in logic low output level of comparator K2 can be compensated for by using a level shifting circuit or by using a negative power supply rail that is below the desired logic low output voltage. The effect of resistor R11 in raising the impedance of the current path through transistor N13 over that of the transistor (N11 or N12) that is receiving a logic high gate input may be adjusted by sizing transistor N13 slightly larger than transistors N11 and N12.

The singlential comparator thus removes common mode error by sharing current equally with a single-ended input stage when the single-ended input signal is in a high logic state and shunting current away from the single-ended input state when the single-ended input signal is in a low logic state. Since the sharing or shunting action of the differential input transistors is controlled by constant-current sink I11, common mode error is cancelled, since the shared current and the shunted current are substantially constant within a useable range of input signals.

Figure 4:
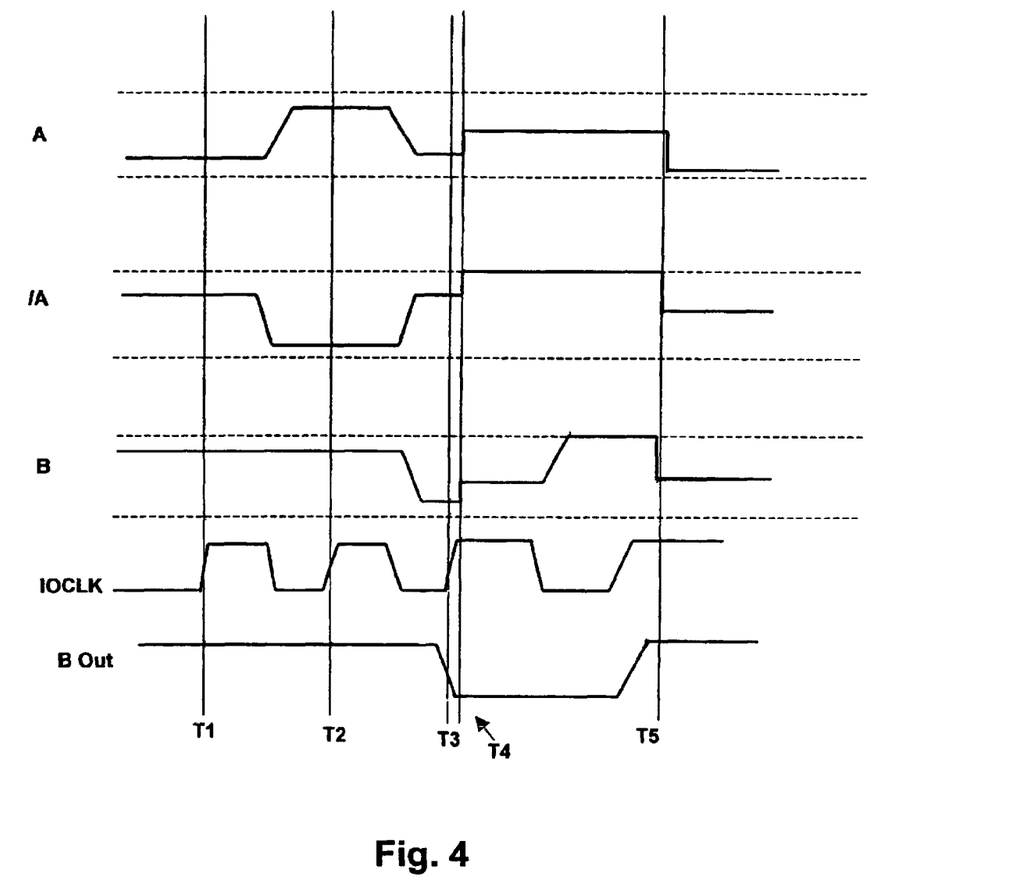
FIG. 4 is a timing diagram depicting signals within the receiver of FIG. 2.

Referring now to FIG. 4, signals within the receiver of FIG. 2 are depicted in a timing diagram, and further illustrating the operation of the singlential comparator depicted in FIG. 3B. Before time T1, data signal B and complementary data signal /A from the differential data signal pair are at a high voltage level with respect to data signal A from the differential data signal pair. Transistors N13 and N11 therefore share the current sourced into constant-current sink I11 and the voltage drop across resistor R11 will produce a logic low level at the output of singlential comparator K2. The output of singlential comparator K2 is latched and inverted, resulting in a high logic level at B Out when IOCLK transitions to a high logic state at time T1.

When the differential data signal pair transitions to the opposite logic state just prior to time T2, transistor N12 will share the current sourced into constant-current sink I11 with transistor N13, maintaining the low logic level at the drain of transistor N13 producing a logic low level at the output of singlential comparator K2, resulting in a high logic level output at B Out when IOCLK transitions again to a high logic level. When single-ended signal B transitions to a logic low level and the differential data signal pair also transistions prior to time T3, transistor N13 is turned off and the majority of the current sourced into constant-current sink I11 is sourced by transistor N11. When a common-mode voltage shift is experienced, as shown at time T4, the gate voltage of each of transistors N11, N12, and N13 is increased, but a logic low level is maintained at the output of singlential comparator K2, as transistor Nil will still conduct the majority of current sourced into constant-current source I11.

After time T4, data signal B is depicted as returning to a high logic level, which will cause transistor N13 to share current with transistor Nil producing a voltage drop across resistor R11 and producing a logic low output from singlential comparator K2. At time T5 a drop in common-mode voltage is illustrated. Transistor N13 will continue to share current equally with transistor N11 and transistor N12 will be turned more fully off due to the drop in common-mode voltage.

Common-mode rejection is provided within the singlential comparator by the action of N-channel transistors N11 and N12. Since the sum of the currents through transistors N11 and N12 represents the sum of the voltages at their inputs, it represents an average voltage, which is the common-mode voltage. As signal swing is reduced, the operation of singlential comparator K2 becomes less effective in shunting current versus sharing current, but the averaging effect can maintain detection for lowered signal swings if the gain of singlential comparator K2 is set at a high level by resistor R11 and constant-current sink I1 is operational for the low logic level input voltage. Other circuits may be implemented that derive an effective reference from a differential data signal and compare it to a single-ended data signal and thus constitute equivalent circuits for use within alternative embodiments of the present invention.

The gain of the singlential comparator is set in part by resistor R11 which has a value twice that of resistor R1 within the differential comparator of FIG. 3A. Since transistors N11 and N12 will effectively conduct twice the average current that a single transistor N1 or N2 of FIG. 3A would conduct, the doubled resistance of resistor R11 over the resistance of R1 raises the gain of the singlential comparator so that it is equal to the gain of the differential comparator of FIG. 3A. The size of transistors N1 and N2 of FIG. 3A and transistors N11, N12, and N13 should be equal, so that the gain of the differential comparator and the singlential comparator are balanced.

Figure 5:
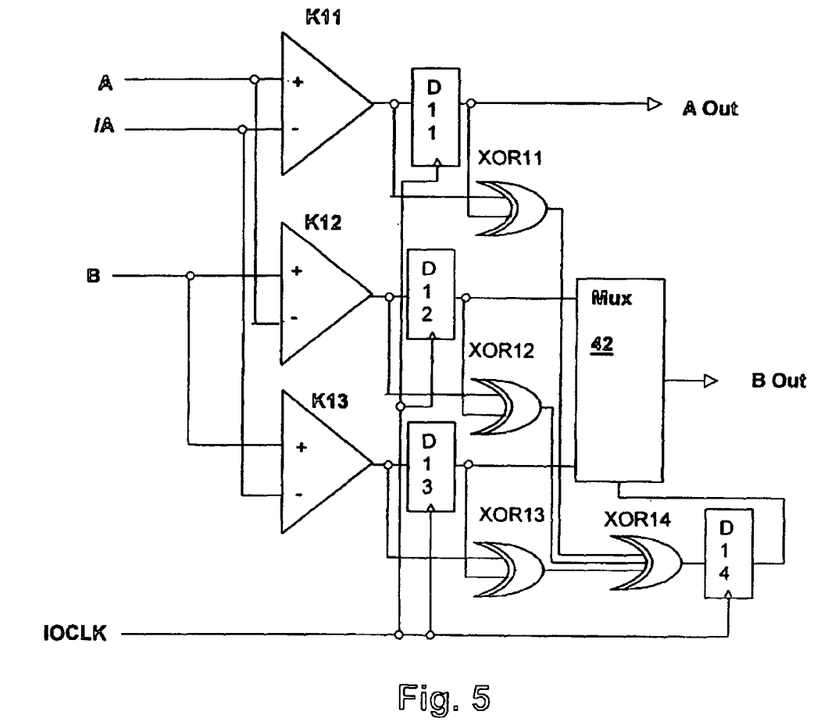
FIG. 5 is a schematic diagram of a receiver in accordance with an alternative embodiment of the invention.

Referring now to FIG. 5, a receiver in accordance with an alternative embodiment of the invention is depicted. Rather than using the singlential comparator of the preferred embodiment, the alternative embodiment uses multiple differential comparators. Differential comparator K11 compares signals A and /A to produce data output signal A Out. A latch D11 latches output of differential comparator K11 on the rising edge of IOCLK (IOCLK is a clock signal derived such that data will be stable at the outputs of comparator K11 when IOCLK rises). A second differential comparator K12 compares data signal A with single-ended data signal B and a third differential comparator K13 compares complementary data signal /A with single-ended data signal B. A latch D12 latches output of differential comparator K12 on the rising edge of IOCLK and a latch D13 latches output of differential comparator K13 on the rising edge of IOCLK.

Data output B Out is provided by a multiplexer 42 that selects between the output of latch D12 or latch D13. The selection is made by the output of a latch D14, which latches the output of an exclusive-OR gate XOR14. By selecting the output of the latch that latches the output of comparator (K12 or K13) for which the input signals are in different states, common-mode rejection is provided. For example, when data signals A and B are both in the same logic state, the output of comparator K13 has the best common-mode rejection and therefore the output of latch D13 should be selected by multiplexer 42. When data signals A and B are in different logic states, the output of comparator K12 has the best common-mode rejection and therefore the output of latch D12 should be selected by multiplexer 42.

The circuit shown in FIG. 5 is designed for use with data signals that start the data cycle always in a logic low state. Thus prior to IOCLK rising, data signals A and B will be in a logic low state and complementary data signal /A will be in a logic high state. The logic network composed of exclusive-OR gates XOR11, XOR12, XOR13 and XOR14 create the selection signal latched by latch D14. Exclusive-OR gate XOR11 detects the difference between the prior state of data signal A and the present state of data signal A, providing a change detect signal. Similarly, exclusive-OR gate XOR12 detects the difference between the prior state of the output of comparator K12 and the present state of the output of comparator K12 and exclusive-OR gate XOR12 detects the difference between the prior state of the output of comparator K13 and the present state of the output of comparator K13.

Since the outputs of the change detectors provided by exclusive-OR gates XOR11, XOR12, XOR13 are combined by exclusive-OR gate XOR14 to form the selection signal that is latched by latch D14, if only one of the data signals has changed from the initial state (A=B=0, /A=1), indicating that data signals A and B are in different states, then the output of exclusive-OR gate XOR14 will be high, selecting the output of latch D13. Otherwise, if neither data signal changes state or both signals changes state, then the output of exclusive-OR gate XOR14 will be low, selecting the output of latch D12. Comparator K13 is optional, as is latch D13 and exclusive-OR gate XOR13. Use of the optional circuitry permits the comparator that switches first (K12 or K13) to cause the selection in multiplexer 42 to occur. Since comparators typically have asymmetrical switching times, the optional components improve performance.

The result of the operation of the circuit of FIG. 5 is an A Out signal and a B Out signal that are very closely time-aligned, are representative of their corresponding A and B data input signals and have common mode error removed.

While the invention has been particularly shown and described with reference to the preferred embodiment thereof, it will be understood by those skilled in the art that the foregoing and other changes in form, and details may be made therein without departing from the spirit and scope of the invention.

What is claimed is:

1. An interface for interconnecting electronic components, comprising:
   a first input for receiving a single-ended data signal;
   a second input for receiving a non-inverted signal of a differential data signal pair;
   a third input for receiving an inverted signal of said differential data signal pair; and
   a receiver coupled to said first input, said second input and said third input for detecting a value of said single-ended data signal, said detected value representative of a binary logic state of said single-ended data signal, wherein detection of said value of said single-ended data signal is made in conformity with a common mode value of said differential data signal pair.

2. The interface of claim 1, wherein said receiver comprises:
   a differential comparator coupled to said second input and said third input for detecting a binary logic state of said differential data signal pair; and
   a singlential comparator coupled to said differential comparator and further coupled to said first input, said second input and said third input for detecting said value of said single-ended data signal in conformity with said common mode value of said differential data signal pair.

3. The interface of claim 2, wherein said singlential comparator sums said non-inverted signal of said differential data signal pair and said inverted signal of said differential data signal pair to provide a reference value for detecting said single-ended data signal.

4. The interface of claim 2, wherein said singlential comparator comprises means for summing said non-inverted signal of said differential data signal pair and said inverted signal of said differential data signal pair to provide a reference for detecting said value of said single-ended data signal.

5. The interface of claim 3, wherein said singlential comparator comprises:
   a first transistor having a gate coupled to said first input;
   a second transistor having a gate coupled to said second input;
   a third transistor having a gate coupled to said third input; and
   a current source coupled to a channel connection of said first transistor, a channel connection of said second transistor and a channel connection of said third transistor, whereby said singlential comparator detects said value of said single-ended data signal in conformity with an average of a second value of said non-inverted signal and a third value of said inverted signal of said differential data signal pair.

6. The interface of claim 5, wherein said differential comparator comprises:
   a fourth transistor having a gate coupled to said second input; and
   a fifth transistor having a gate coupled to said third input and a first channel connection coupled to a resistor for providing active mode operation; and
   a current source coupled to a channel connection of said fourth transistor and a second channel connection of said fifth transistor, whereby said differential comparator detects a difference between said value of said non-inverted signal and said value of said inverted signal of said differential data signal pair, and wherein a gain of said differential comparator in an active region of operation is equal to a gain of said singlential comparator.

7. The interface of claim 2, wherein said receiver further comprises a multiplexer for producing a data output signal corresponding to said single-ended data signal, having a first input coupled to an output of said differential comparator, a second input coupled to an inverted output of said differential comparator, and a select input coupled to said output of said differential comparator and an output of said singlential comparator such that said output of said differential comparator is selected when said single-ended signal is at an equal logic value with said differential data signal pair and wherein said inverted output of said differential comparator is selected when said single-ended signal and said differential data signal pair are at unequal logic levels.

8. The interface of claim 7, wherein said receiver further comprises:
   a first latch for coupling said differential comparator to said multiplexer, said first latch having an input coupled to said output of said differential comparator and an output coupled to said first input of said multiplexer;
   an inverter having an input coupled to said output of said first latch for producing said inverted output of said differential comparator and having an output coupled to said multiplexer;
   a second latch for latching said output of said singlential comparator; and
   an exclusive-OR gate having a first input coupled to said output of said first latch and a second input coupled to an output of said second latch and an output coupled to a select input of said multiplexer for selecting said output of said first latch when said single-ended data signal is at an equal logic value with said binary logic state of said differential data signal pair and for selecting said output of said inverter when said single-ended signal and said differential data signal pair are at unequal logic levels.

9. The interface of claim 1, wherein said receiver comprises:
   a first differential comparator coupled to said second input and said third input;
   a second differential comparator coupled to said second input and said first input;
   a third differential comparator coupled to said third input and said first input; and
   means for selecting between an output of said second differential comparator and an output of said third differential comparator to produce a data output corresponding to said binary logic state of said single-ended data signal.

10. The interface of claim 1, wherein said receiver comprises:
   a first differential comparator coupled to said second input and said third input;
   a second differential comparator coupled to said first input and said second second input;
   a third differential comparator coupled to said first input and said third input; and
   a logic circuit coupled to said first differential comparator, said second differential comparator and said third differential comparator for selecting between an output of said second differential comparator and said third differential comparator to produce a data output corresponding to said binary logic state of said single-ended data signal.

11. The interface of claim 10, wherein said logic circuit comprises:
   a multiplexer for producing said data output corresponding to said binary logic state of said single-ended data signal;
   a first latch having an input coupled to an output of said first differential comparator;
   a second latch having an input coupled to an output of said second differential comparator and an output coupled to a first input of said multiplexer;
   a third latch having an input coupled to an output of said third differential comparator and an output coupled to a second input of said multiplexer;
   a first exclusive-OR gate having inputs coupled to said input of said first latch and said output of said first latch for detecting a difference between a present state and a prior state of said output of said first differential comparator
   a second exclusive-OR gate having inputs coupled to said input of said second latch and said output of said second latch for detecting a difference between a present binary logic state and a prior binary logic state of said output of said second differential comparator; and
   a third exclusive-OR gate having inputs coupled to an output of said first exclusive-OR gate and an output of said second exclusive-OR gate, and having an output coupled to a select input of said multiplexer, for performing said selecting.

12. The interface of claim 11, further comprising a fourth exclusive-OR gate having inputs coupled to said input of said third latch and said output of said third latch for detecting a difference between said present binary logic state and said prior binary logic state of said output of said third differential comparator, and wherein said fourth exclusive-OR gate has an output coupled to an input of said third exclusive-OR gate.

13. A method for signaling over an electronic interface, said method comprising:
   transmitting a differential data signal pair;
   transmitting a single-ended data signal;
   receiving said differential data signal pair; and
   detecting a value of said single-ended data signal in conformity with a common-mode value of said received differential data signal pair, wherein said detected value is representative of a binary logic state of said single-ended data signal.

14. The method of claim 13, wherein said detecting a value of said single-ended data signal comprises:
   deriving a reference from said differential pair of data signals; and
   detecting a difference between said value of said single-ended data signal and said derived reference.

15. The method of claim 14, wherein said deriving comprises summing currents proportional to a second value of a non-inverting signal of said differential data signal pair and a third value of an inverting signal of said differential data signal pair, and wherein said detecting of said difference between said value of said single-ended data signal and said derived reference comprises balancing a current proportional to said value of said single ended data signal against said summed currents.

16. The method of claim 13, wherein said detecting a value of said single-ended data signal comprises:
   comparing a third value of a non-inverting signal of said differential pair to a second value of an inverting signal of said differential pair;
   comparing said value of said single-ended data signal to said third value of said non-inverting signal of said differential data signal pair;
   comparing said value of said single-ended data signal to said second value of said inverting signal of said differential data signal pair; and
   selecting between a result of said comparing of said third value to said second value and said comparing of said value of said single-ended data signal to said second value, in conformity with a result of said first comparing and said second comparing.

17. The method of claim 16, wherein said selecting is further performed in conformity with a result of said third comparing.

* * * * *